United States Patent
Park et al.

(10) Patent No.: US 12,315,807 B2
(45) Date of Patent: May 27, 2025

(54) REDUCING COPPER LINE RESISTANCE

(71) Applicant: International Business Machines Corporation, Armonk, NY (US)

(72) Inventors: Chanro Park, Clifton Park, NY (US); Kenneth Chun Kuen Cheng, Shaun (HK); Koichi Motoyama, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 596 days.

(21) Appl. No.: 17/566,949

(22) Filed: Dec. 31, 2021

(65) Prior Publication Data

US 2023/0215806 A1    Jul. 6, 2023

(51) Int. Cl.
*H01L 23/532* (2006.01)
*H01L 21/768* (2006.01)

(52) U.S. Cl.
CPC .. *H01L 23/53238* (2013.01); *H01L 21/76802* (2013.01); *H01L 21/76819* (2013.01); *H01L 21/76846* (2013.01)

(58) Field of Classification Search
CPC ......... H01L 23/53238; H01L 21/76846; H01L 21/76852
See application file for complete search history.

(56) References Cited

U.S. PATENT DOCUMENTS 5,674,787 A    10/1997  Zhao et al.
6,046,108 A     4/2000  Liu et al.
(Continued)

FOREIGN PATENT DOCUMENTS

JP    2011503874 A    1/2011
KR    20190104902 A    3/2019
WO    2019066792 A1   4/2019

OTHER PUBLICATIONS

Anonymous, "Method for increasing the grain size of copper interconnects to reduce resistance due to grain boundary scattering ", IPCOM000134797D, Mar. 21, 2006.
(Continued)

*Primary Examiner* — Eliseo Ramos Feliciano
*Assistant Examiner* — Mikka Liu
(74) *Attorney, Agent, or Firm* — L. Jeffrey Kelly

(57) ABSTRACT

A structure and a method for fabricating interconnections for an integrated circuit device are described. The method forms a metal interconnection pattern having a first barrier layer and a copper layer in a set of trenches in a first dielectric layer over a substrate. In a selected area, the first dielectric layer is removed to so that the first barrier layer can be removed at the exposed vertical surfaces. A thin second barrier layer is deposited over the exposed vertical surfaces of the first copper layer. A structure includes a first feature formed in a first dielectric layer which has a first barrier layer disposed on vertical surfaces of the first dielectric layer and surrounds opposing vertical surfaces and a bottom surface of a copper layer. The structure also includes a second feature formed in a second dielectric layer which has a second barrier layer disposed on vertical surfaces of the second dielectric layer and two vertical surfaces of the copper layer and a bottom surface of the first copper layer is disposed over the first barrier layer.

17 Claims, 15 Drawing Sheets

(56) References Cited

U.S. PATENT DOCUMENTS

| | | | |
|---|---|---|---|
| 6,162,728 A * | 12/2000 | Tsao | H01L 21/76865 |
| | | | 257/E21.586 |
| 6,887,297 B2 | 5/2005 | Winter et al. | |
| 7,507,659 B2 | 3/2009 | Ohtsuka et al. | |
| 7,858,519 B2 | 12/2010 | Liu et al. | |
| 8,133,813 B2 | 3/2012 | Koike et al. | |
| 8,361,900 B2 * | 1/2013 | Pan | H01L 21/76831 |
| | | | 438/660 |
| 9,449,874 B1 | 9/2016 | Standaert et al. | |
| 9,793,156 B1 | 10/2017 | Yang | |
| 10,204,829 B1 * | 2/2019 | Amanapu | H01L 21/7684 |
| 10,224,242 B1 | 3/2019 | Yang et al. | |
| 10,224,284 B1 | 3/2019 | Witt | |
| 2005/0003660 A1 | 1/2005 | Murakawa et al. | |
| 2005/0224786 A1 * | 10/2005 | Lin | H10D 30/62 |
| | | | 257/E21.143 |
| 2013/0056836 A1 * | 3/2013 | Yu | H01L 21/823814 |
| | | | 257/E21.409 |
| 2016/0111325 A1 * | 4/2016 | JangJian | H01L 23/53295 |
| | | | 257/774 |
| 2017/0005037 A1 | 1/2017 | Liang et al. | |
| 2019/0074219 A1 | 3/2019 | Zhang et al. | |
| 2019/0139894 A1 | 5/2019 | Adusumilli et al. | |
| 2019/0164897 A1 * | 5/2019 | Yeoh | H10B 10/12 |
| 2019/0304918 A1 * | 10/2019 | Griggio | H01L 21/76858 |
| 2019/0371735 A1 | 12/2019 | van der Straten et al. | |
| 2020/0373410 A1 * | 11/2020 | Lee | H01L 21/28568 |
| 2022/0013353 A1 * | 1/2022 | Lu | H01L 29/40111 |
| 2022/0157710 A1 * | 5/2022 | Li | H01L 21/76831 |

OTHER PUBLICATIONS

Anonymous, "Method for a Cu interconnects system with low line resistivity and enhanced EM resistance", IPCOM000132112D, Dec. 1, 2005.

Ohmori, Kazuyuki, Kenichi Mori, Kazuyoshi Maekawa, Kazuyuki Kohama, Kazuhiro Ito, Takashi Ohnishi, Masao Mizuno, Koyu Asai, Masanori Murakami, and Hiroshi Miyatake. "Performance of Cu Dual-Damascene Interconnects Using a Thin Ti-Based Self-Formed Barrier Layer for 28 nm Node and Beyond." Japanese Journal of Applied Physics 49, No. 5S2 (2010): 05FD01.

* cited by examiner

REDUCING COPPER LINE RESISTANCE

BACKGROUND OF THE INVENTION

This disclosure relates to integrated circuit devices, and more specifically, to a method and structure to reducing copper line resistance when manufacturing semiconductor devices.

In semiconductor chips, the devices fabricated in or on a semiconductor substrate are connected with a metallic interconnection structure made of metal lines and "vias" which interconnect the metal lines. The metal lines are arranged in horizontal layers, i.e., parallel to the substrate, and separated by layers of dielectrics while vias are disposed vertically in openings in the dielectric to interconnect the layers of metal lines. For 5 nm chips and beyond, copper as a material for lines, vias and other interconnects is reaching its limit in terms of resistivity, filling and reliability.

For example, in a copper (Cu) Dual Damascene process, the barrier metal thickness does not scale; as the metal lines get narrower, the barrier layer and other layers take up a proportionately greater volume of the metal line interconnect. A high ratio of barrier layer to the copper layer found in narrow line widths increases the metal line resistance and becomes a greater and greater problem with narrowing line widths. While alternative metals such as ruthenium, molybdenum, and cobalt are being investigated as replacements for copper, new processes are needed to include the alternative metals in semiconductor chip fabrication both for the metal layers and other layers used in adjacent layers. Thus, it is desirable to extend copper technology to have as low line resistance as possible at small dimensions so that difficult new technology development for alternative materials can be avoided.

Thus, improving the ability to fabricate interconnect structures using copper at the small dimensions which are forecast to be required in semiconduction structure is desirable. The present disclosure presents a method and a structure to address the above described problem.

SUMMARY

According to this disclosure, a structure and a method for fabricating interconnections for an integrated circuit device are described. According to one aspect of the invention, a method forms a metal interconnection pattern in a set of trenches in a first dielectric layer over a substrate. The metal interconnection pattern has a first barrier layer disposed next to the first dielectric layer and a first copper layer filling a remainder of the trench not filled by the first barrier layer. In a selected area, the first dielectric layer is removed to expose the vertical surfaces of the first barrier layer. The first barrier layer is removed at the exposed vertical surfaces in the selected area to expose the first copper layer. A thinner second barrier layer is deposited over the exposed vertical surfaces of the first copper layer.

In another aspect of the invention, a structure includes a first dielectric layer over a substrate. A first feature formed in the first dielectric layer has a first barrier layer disposed on vertical surfaces of the first dielectric layer and surrounds opposing vertical surfaces and a bottom surface of a copper layer. The structure also includes a second dielectric layer over the substrate. A second feature formed in the second dielectric layer has a second barrier layer disposed on vertical surfaces of the second dielectric layer and two vertical surfaces of the copper layer. In the second feature, a bottom surface of the first copper layer is disposed over the first barrier layer.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which.

DETAILED DESCRIPTION OF THE DRAWINGS

Figure 1:
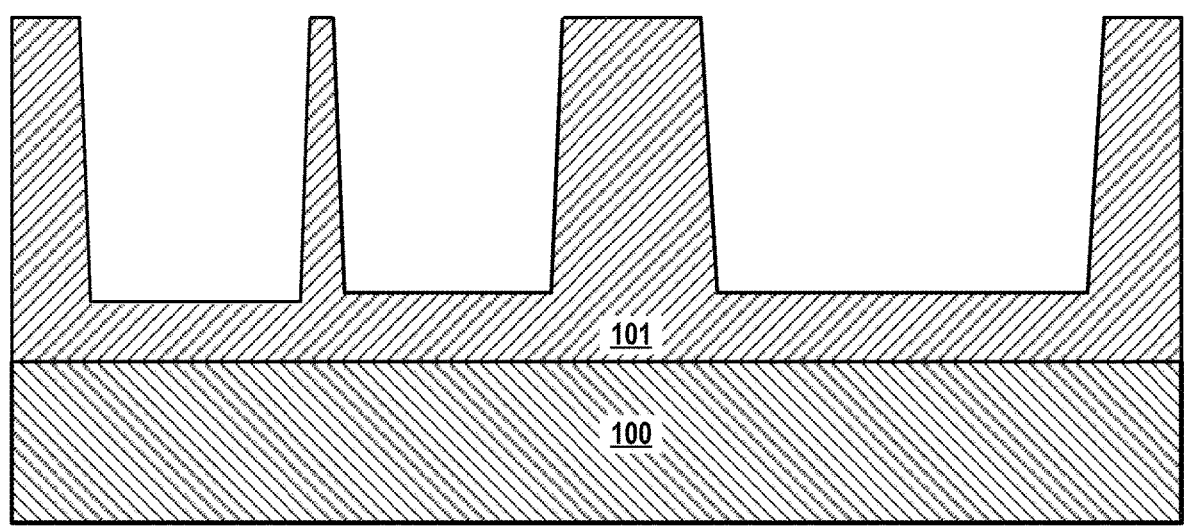
FIG. 1 is a cross-sectional diagram depicting an intermediate structure after a trench patterning process according to a first embodiment of the invention.

At a high level, embodiments of the invention provide a selective etch and deposition process which provides improved conductivity for relatively small features in a semiconductor interconnect structures while maintaining desired physical characteristics for relatively large features in the interconnect structures. As compared to the prior art, the smaller features have larger proportion of a relatively higher conductivity metal such as copper or a copper alloy. Also, embodiments of the invention allow the chip designer to selectively determine the relative proportions of copper and barrier layers which make up different features in a given layer of the semiconductor chip. In this way, selected features of the semiconductor chip can have increased or adjusted conductivity within the same layer of the chip as compared to prior art methods wherein in features are processed identically, irrespective of the size of the feature. The benefits of the invention include tailored conductivity of features in the same layer using different processing and relative proportions of the metallic layers of each feature.

When patterning any material herein, the material to be patterned can be grown or deposited in any known manner and a patterning layer (such as an organic photoresist aka "resist") can be formed over the material. The patterning layer (resist) can be exposed to some form of light radiation (e.g., patterned exposure, laser exposure) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching) to remove the unprotected portions of the material to be patterned. The resist is subsequently removed to leave the underlying material patterned according to the light exposure pattern.

Aspects of the present invention will be described in terms of a given illustrative embodiment; however, other embodiments which include other structures, substrates, materials and process features and steps can be varied within the scope of aspects of the present invention.

When an element such as a layer, region or substrate is referred to as being "on" or "over" another element, it can be directly on the other element or intervening elements can also be present. In contrast, when an element is referred to as being "directly on", "directly over" or "contacting" another element, there are no intervening elements present. When an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Those skilled in the art will appreciate that descriptions in the specification to an embodiment means that a particular feature, structure, characteristic, is included in at least one embodiment, but not all embodiments. The phrase "in an embodiment", as well any other variations, appearing in various places throughout the specification are not necessarily all referring to the same embodiment.

Embodiments will be explained below with reference to the accompanying drawings.

FIG. 1 is a cross-sectional diagram depicting an intermediate structure after a trench patterning process according to a first embodiment of the invention. Substrate layer 100 represents any layer or set of layers in a semiconductor device. In preferred embodiments, the substrate comprises a number of metal layers, dielectric layers and semiconductor material layers arranged to provide semiconductor devices, such as field effect transistors (FETs), fin type field effect transistors (FinFETs), bipolar junction transistors (BJT) and combinations thereof.

On top of the substrate layer 100 is a dielectric layer 101. In preferred embodiments, the dielectric layer 101 comprises a low-k dielectric, however, in other embodiments, dielectrics such silicon dioxide ($SiO_2$), silicon nitride (SiN), and silicon carbide (SiC) are used. Though not pictured, a patterning layer(s) is deposited and patterned according to known processes. The lithographic stack can include a resist layer, an organic planarization layer (OPL) and an antireflective coating (ARC) layer. Other known lithography processes are used in other embodiments of the invention. A requirement of embodiments of the invention at small dimensions is that the lithography process chosen be capable of patterning features at the desired dimension. The patterning layer is used to form a set of recesses such as trenches for metal lines using an etch step. As shown, the trenches to the left of the figure are of a smaller dimension than the trench to the right. The trenches to the left are illustrative of how "tight pitch" or other selected areas are processed in the invention.

Figure 2:
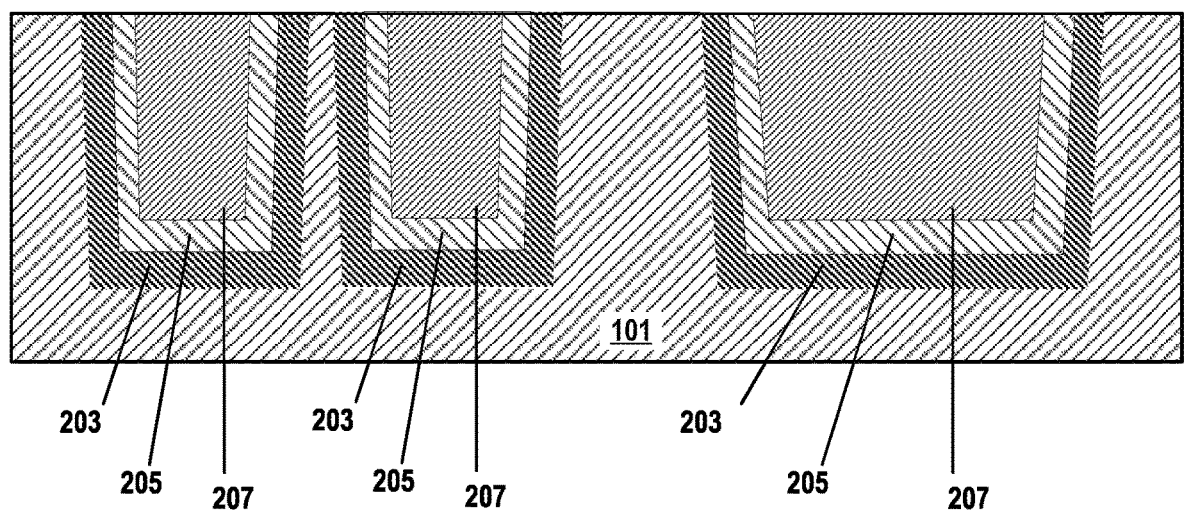
FIG. 2 is a cross-sectional diagram depicting the structure in an intermediate stage after barrier layer, liner layer and copper depositions followed by a planarization process according to a first embodiment of the invention.

FIG. 2 is a cross-sectional diagram depicting the structure in an intermediate stage after barrier layer, liner layer and copper depositions followed by a planarization process according to a first embodiment of the invention. Barrier layer 203 is deposited on the sidewalls of the trenches in the dielectric layer 101. In some embodiments, liner layer 205 is deposited on the surface of barrier layer 203. The functions of a barrier layer and a liner layer include adhesion to the substrate so that subsequent layers have a strong physical bond to the dielectric layer 101. A "barrier" layer 203 can also functions for diffusion protection; copper and copper alloys are known to diffuse into dielectric layers. A "liner" layer 205 often functions as a seed layer so that the subsequent layers have good deposition characteristics. In some embodiments, tantalum nitride (TaN) and titanium nitride (TiN) are suitable as barrier layers. In some embodiments, ruthenium (Ru) and/or cobalt (Co) are suitable for liner layers. In embodiments of the invention, the functions of the barrier layer and liner layer can be combined into a single layer. Conventional deposition processes such as physical vapor deposition (PVD) are used in embodiments of the invention. In other embodiments, other conventional deposition processes such as an atomic layer deposition (ALD), chemical vapor deposition (CVD), plasma enhanced chemical vapor deposition (PECVD) are used. Other suitable liner layers such as titanium zirconium nitride (TiZrN), amorphous tantalum manganese oxide (TaMnO) are used in other embodiments.

On top of liner layer 205 is metal layer 207, which comprises copper or a copper alloy in preferred embodiments. The metal layer 207 will typically be deposited in an overburden layer which fills the remainder of the trench volume which are not filled by the barrier layer 203 and the liner layer 205 and some excess material which is deposited over the trench and field areas of the dielectric (the "overburden"). As shown in the figure, the Cu overburden as well as excess barrier layer and liner layer material have been removed by a planarization process such as chemical mechanical polishing (CMP) process. As implied by its name, CMP is a process in which chemical and mechanical components work together to improve the removal of material from the semiconductor wafer and is a well-known semiconductor process.

As can be seen in the drawing, the barrier layer 203 and the liner layer 205 fill a greater proportion of the small, tight pitch features to the left of the drawing than the layers fill of the larger feature to the right. Since the barrier and liner layer materials often do not have the conductivity of copper, this means that the small features have lower conductivity and greater resistance. The invention alleviates this problem.

In embodiments where both the barrier and liner layers are used, a sufficient deposition thickness should be formed for each layer to provide good coverage of that layer; a representative thickness of each layer is on the order of 2 nm each provides for good mechanical coverage, for a total thickness of 4 nm. As will be seen in further processing steps, the barrier layer 203 and liner layer 205 deposited on the sidewalls of the dielectric trenches will be removed and replaced with a single thin layer (1 nm) of a second barrier layer in the small dimension features. Thus, in this example, the width of the small trenches is 6 nm greater than the final target dimension for the metal lines being formed in the small trenches.

Figure 3:
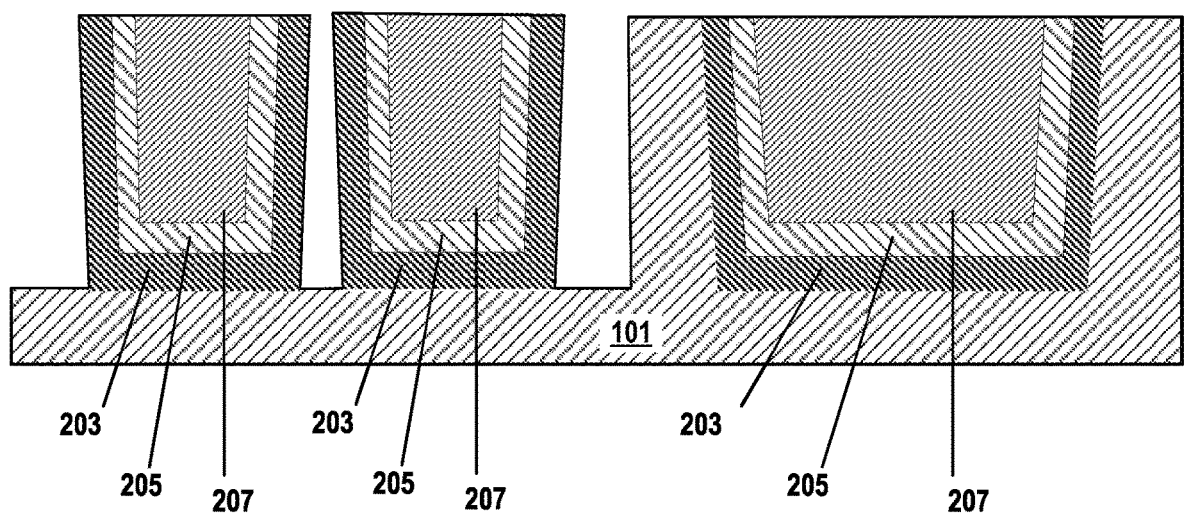
FIG. 3 is a cross-sectional diagram depicting the structure after selected, tight pitched portions of dielectric are removed according to the first embodiment of the invention.

FIG. 3 is a cross-sectional diagram depicting the structure after selected, tight pitched portions of dielectric are removed according to the first embodiment of the invention. In this drawing, the portion of the low-k dielectric layer 101 around the tight pitched area (and/or additional selected areas) is removed by using a block mask lithography step followed by an etch step. In the drawing, the right trench is in an excluded area (i.e., not a selected area) which is excluded from the dielectric etch and so will retain the first barrier layer 203 and liner layer 205 on the sidewalls due to the protection of the dielectric layer 101. One suitable etch process is to recess low-k dielectric layer is a reactive ion etch (RIE) process. In some embodiments, the block mask is an optional step in embodiments in which all of the low-k dielectric is removed instead of only the dielectric in the selected tight pitched regions. This will save a block lithography step but may cause a deep low-k dielectric recess in loosely pitched regions due to a plasma etch loading effect.

In the embodiment portrayed in the drawing, this part of the process exposes the barrier layer 203 and the liner layer 205 in elements of the interconnect layer where relatively thick layers of these layers are a disadvantage because of conductivity and leaving the dielectric in areas where keeping the full thickness of the barrier and liner layers are an advantage or at least neutral. The tradeoffs in deciding whether to remove the dielectric or not for a given feature is related to the size of the features in embodiments of the invention. A smaller feature may be a candidate for the inventive process because the volume taken by the barrier and liner layers may be too much to maintain the desired conductivity or resistance. As a larger feature contains proportionally more copper, it may be better to retain the full thickness of the barrier and liner layers, since there is a sufficient proportion of copper in the feature to obtain the desired conductivity or resistivity and the deep dielectric recess is undesirable. While there is no clear cut-off dimension in terms of whether a particular feature should be protected or undergo additional processing, in general, a total metal line width less than 12 nm using copper and the deposited barrier and liner layers is not likely competitive in terms of line resistance without thinning down the aggregate barrier/liner layer thickness. The added process complexity of the invention is justified by the performance gains of the low resistances of the "smaller" features in the selected areas.

Figure 4:
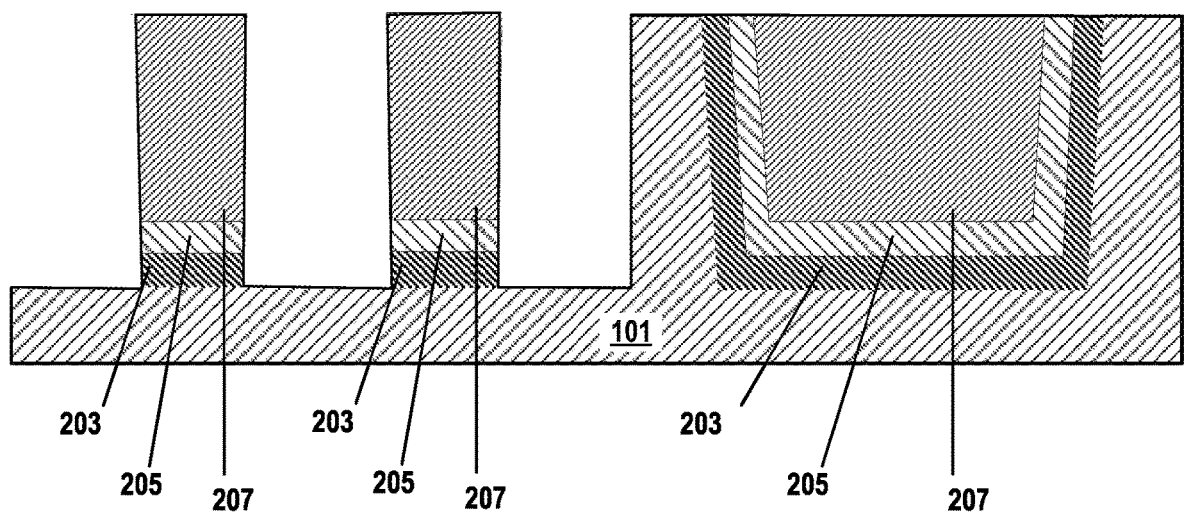
FIG. 4 is a cross-sectional diagram depicting the structure after the exposed barrier layer and liner layer are removed according to the first embodiment of the invention.

FIG. 4 is a cross-sectional diagram depicting the structure after the exposed barrier layer and liner layer are removed according to the first embodiment of the invention. In this drawing, the exposed barrier layer and liner layer have been removed in the smaller features but in the larger features, these layers are protected by the dielectric layer 101. In an illustrative embodiment, the exposed barrier and liner layers, e.g., TaN and Co respectively, can be removed by a wet etch process. A mixture of potassium hydroxide (KOH) and hydrogen peroxide ($H_2O_2$) or a mixture of sodium hydroxide (NaOH) and hydrogen peroxide ($H_2O_2$) can be used to wet etch a TaN layer. A Co liner can be removed by a mixture of water and nitric acid (HNO3) or a mixture of hydrogen peroxide and hydrogen chloride (HCl). Continuing with the above example, at this point in the process, the width of the metal lines in the smaller features is 8 nm less than the initial trench width and 2 nm less than the final target width.

Figure 5:
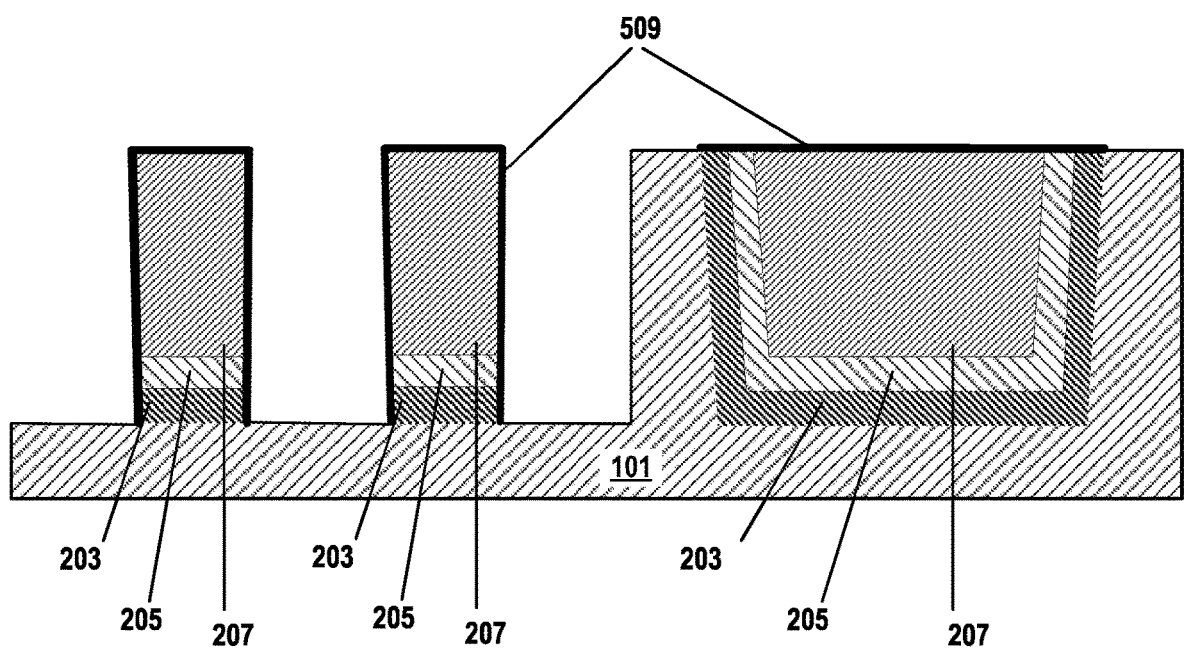
FIG. 5 is a cross-sectional diagram depicting the structure after selective regrowth of a barrier layer according to the first embodiment of the invention.

FIG. 5 is a cross-sectional diagram depicting the structure after selective regrowth of a second barrier layer 509 according to the first embodiment of the invention. In this step, a desired thickness, e.g., a thinner thickness than used in the PVD process used in embodiments of FIG. 2 (for example, 1 nm as compared to 2 nm in the PVD process) is deposited. A thinner second barrier layer 509 enables the smaller features to optimize the barrier layer thickness to a thickness which is strictly needed and do away with the liner layer as it has already served its purposes as a seed or adhesion layer as the metal layer 207 is already deposited. Note that the second barrier layer 509 is deposited on the exposed surfaces including the top surface and the sidewalls of the exposed metallic features as well as the top surfaces of the metallic, large features but not on the dielectric surfaces. A selective barrier layer growth process can deposit TiN or TaN layers as the barrier layer. A barrier layer of 1 nm is "enough" of a thickness using a selective regrowth process as compared to the 2 nm thickness used in the PVD process because the selectively grown TiN or TaN layer is more conformal and continuous than the PVD TiN or TaN used in the PVD process so there is a less risk of a non-continuous barrier layer.

In embodiments of the invention, where both the barrier layer and liner layer are removed, the second barrier layer can be the same thickness as the first barrier layer as there is still the advantage of removing the liner layer. Selective growth of TaN and TiN is a well-known process which is described in the art.

Figure 6:
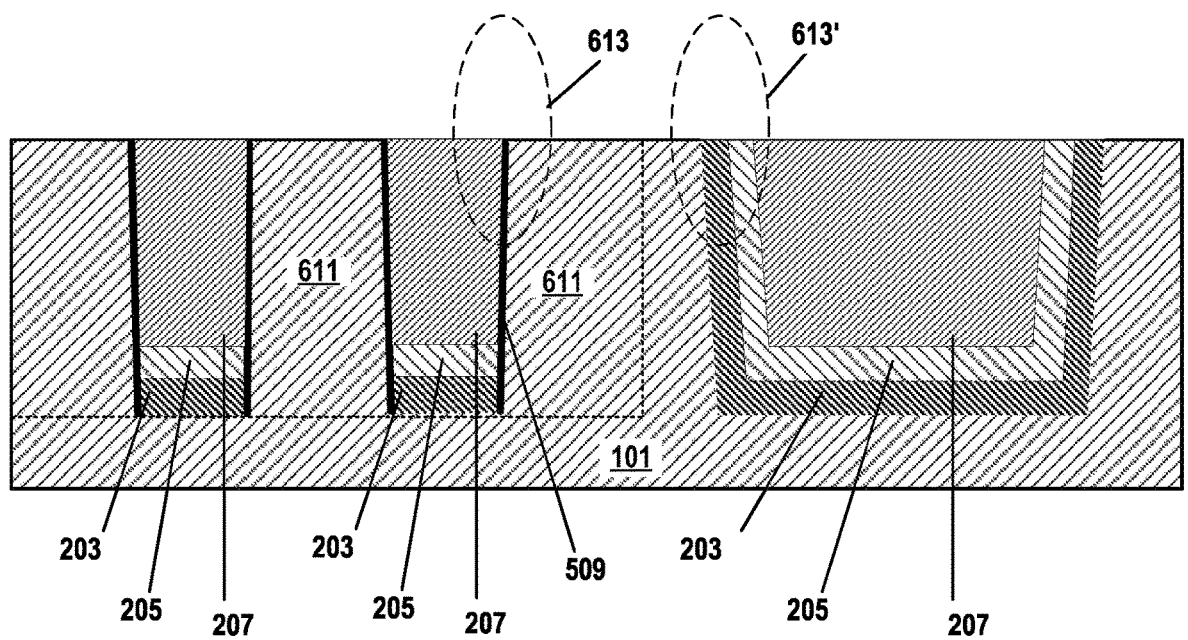
FIG. 6 is a cross-sectional diagram depicting the structure after deposition of a dielectric and a planarization process according to the first embodiment of the invention.

FIG. 6 is a cross-sectional diagram depicting the structure after deposition of a dielectric and a planarization process according to the first embodiment of the invention. The dashed line shows the demarcation between newly deposited and planarized second dielectric layer 611 and existing first dielectric layer 101. In a preferred embodiment, the barrier layer 203 is thicker around the larger features on the vertical sidewalls of the copper layer 207 and first dielectric layer 101 than the second barrier layer 509 is on the vertical sidewalls of the copper layer 207 and second dielectric layer 611 in the smaller features. Also, in embodiments of the invention, as pointed out by dashed regions 613 and 613', the liner layer 205 is present on the sidewalls of the larger features in 613', but not on the sidewalls of the smaller, selected features 613. Note also that the barrier layer 203 and liner layer 205 are equal in thickness for both types (smaller, selected and larger) features at the bottoms of both types of features. Also, in this embodiment, the widths of the barrier layer 203, the liner layer 205 and the metal layer 207 are substantially equal in the smaller features to the left, while the overall width of the barrier layer 203 is greater than the overall width of the liner layer 205 and the overall width of the barrier layer 205 is greater than the overall width of the metal layer 207 in the large feature to the right. In embodiments of the invention, the dielectric used in second dielectric layer 611 is the same as used for first dielectric layer 101. In embodiments of the invention two different dielectrics are used second dielectric layer 611 and first dielectric layer 101. This is useful when an air-gap between dielectric is desired.

As is well known, the interconnections which make up the wiring which connects the individual devices are commonly divided into metal line layers and via layers. Some interconnection layers combine metal line and via elements. FIGS. 1-6 show the process of one embodiment for building a respective interconnection layer, either a metal line layer, a via layer or a mixed layer. Because the features in tightly pitched and loosely pitched regions can have different proportions of copper, barrier and liner layers, the conductivity and resistivity of individual features on each metal layer of the chip can be tailored to desired values. It is known to abbreviate a first metal layer as an M1 layer, a first via layer as V1, and so forth (M2, V2, M3, etc.). In this embodiment, both first dielectric layer 101 and second dielectric layer are in the same interconnection layer.

Figure 7:
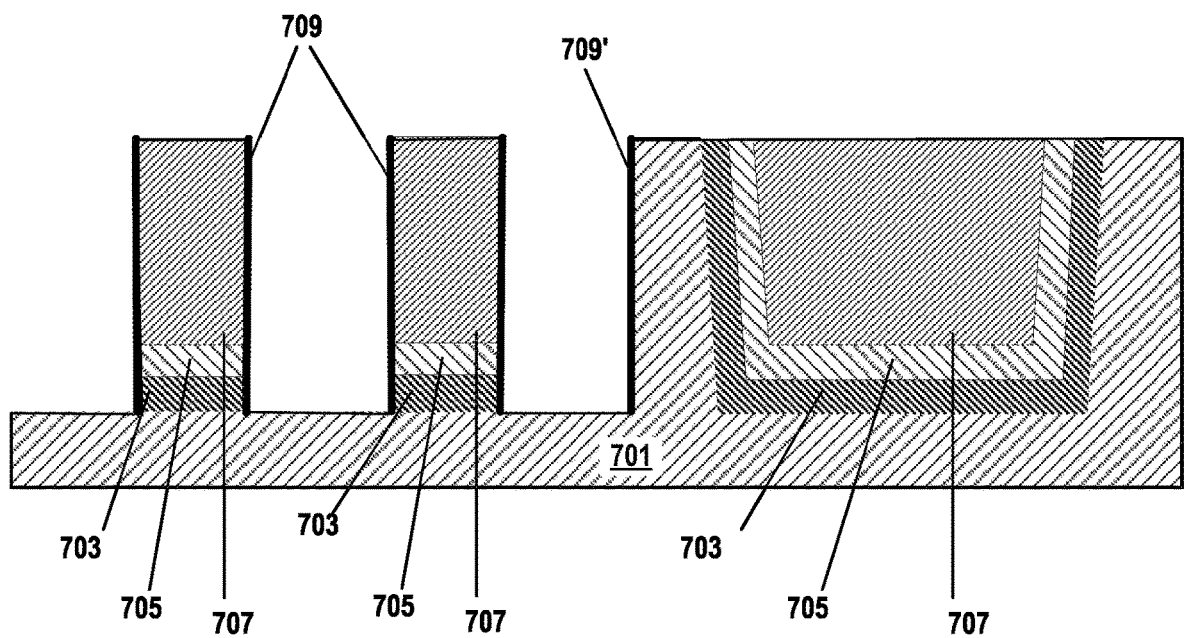
FIG. 7 is a cross-sectional diagram depicting the structure after selected, tight pitched portions of dielectric are removed and an atomic layer deposition of a barrier layer according to a second embodiment of the invention.

FIG. 7 is a cross-sectional diagram depicting the structure after selected portions of dielectric are removed and an atomic layer deposition of a barrier layer according to a second embodiment of the invention. This drawing is at similar point in the process to FIG. 5 which depicts the first embodiment. As in the prior embodiment, barrier layer 703 is deposited on the trenches in the dielectric layer 701. In some embodiments, liner layer 705 is deposited on the surface of barrier layer 703. On top of liner layer 705 is metal layer 707. Then the dielectric in selected areas is removed as represented by the left features. Next, an atomic layer deposition of a second barrier layer 709, 709' is performed. This embodiment is different structurally from the previous embodiment as the ALD barrier layer is also deposited on the sidewalls of the dielectric layer forming vertical section/sidewall of the barrier layer 709'. If using an ALD process, TiN or TaN are examples of materials that can be deposited as the barrier layer. Other barrier layers can be deposited using ALD.

Figure 8:
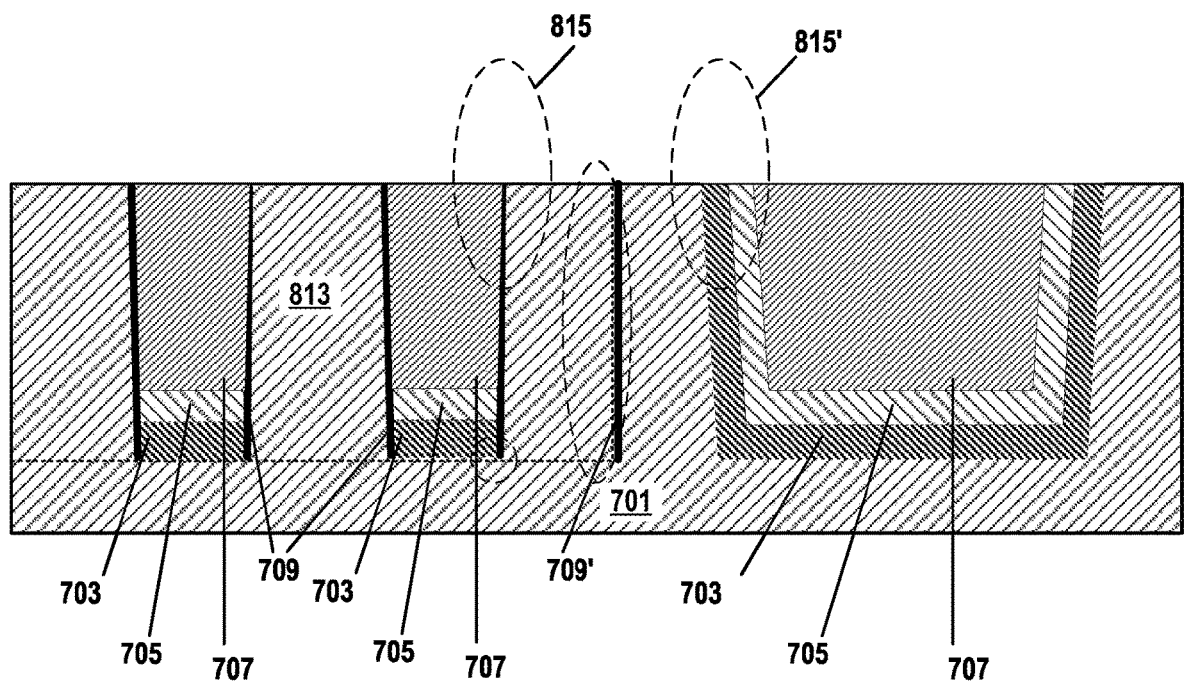
FIG. 8 is a cross-sectional diagram depicting the structure after deposition of a dielectric and a planarization process according to the second embodiment of the invention.

FIG. 8 is a cross-sectional diagram depicting the structure after deposition of a dielectric and a planarization process according to the second embodiment of the invention. The planarized, second dielectric layer 813 is shown in the region of the tightly pitched area, i.e., the left features in the drawing. The materials and processes used are similar to those discussed above in connection with the first embodiment. Like the first embodiment, the thickness of the barrier layer 703 is greater around the larger features on the sidewalls than the thickness of barrier layer 709 on the sidewalls of the smaller features. Also, similar to the first embodiments of the invention, the liner layer 705 is present on the vertical sidewalls of the larger features, but not on the sidewalls of the smaller, selected features. Note also that the barrier layer 703 and liner layer 705 are equal in thickness for both types of features at the bottom of these features (both smaller, selected and larger). Also, similar to the first embodiment, the widths of the barrier layer 703, the liner layer 705 and the copper/copper alloy layer 707 are substantially vertically, coplanar and similar in overall width in the small features. In some embodiments, there is a slight taper to the original sidewalls of the trenches in the dielectric layer 701 so that the top surface of the copper layer 707 is slightly larger than the top surface of the liner layer 705 which is slightly larger than the width of the top surface of the bottom barrier layer 703 in a given small feature. This is in contrast to the large features where for a respective feature the overall width of the barrier layer 703 is greater than the overall width of the liner layer 705 and the overall width of the barrier layer 705 is greater than the overall width of the copper layer 707. The final structure of this embodiment differs from the first embodiment in that there is a small vertical line of second barrier layer 709' between the small and large features.

Figure 9:
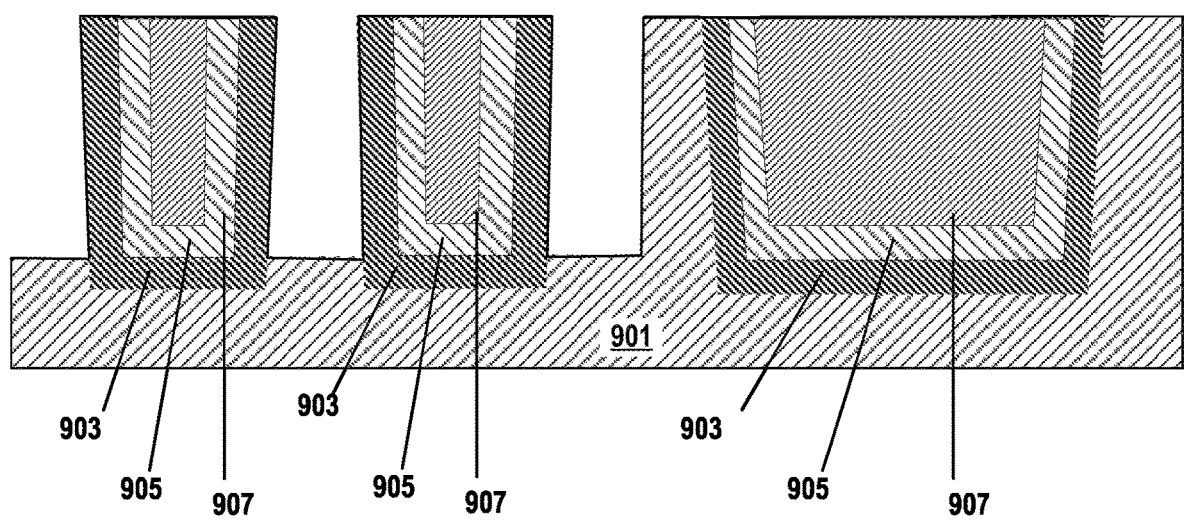
FIG. 9 is a cross-sectional diagram depicting the structure after selected, tight pitched portions of dielectric are removed according to a third embodiment of the invention.

FIG. 9 is a cross-sectional diagram depicting the structure after selected, tight pitched portions of dielectric are removed according to a third embodiment of the invention. Barrier layer 903 is deposited on the in the dielectric layer 901. In some embodiments, liner layer 905 is deposited on the surface of barrier layer 903. On top of liner layer 905 is metal layer 907. This drawing is at similar point in the process to FIG. 5 depicting the first embodiment. As compared to the first and second embodiments, the dielectric layer 901 is etched less (in the drawing approximately level to the top surface of the bottom layer of the barrier layer 903) so that a portion of the sidewalls of the barrier layer 903 of the small features to the left are protected from the subsequent metal etch. Also, because of subsequent processing in this embodiment, the smaller trenches to the left are smaller in width than those of the first and second embodiments to fabricate the same final target width.

Figure 10:
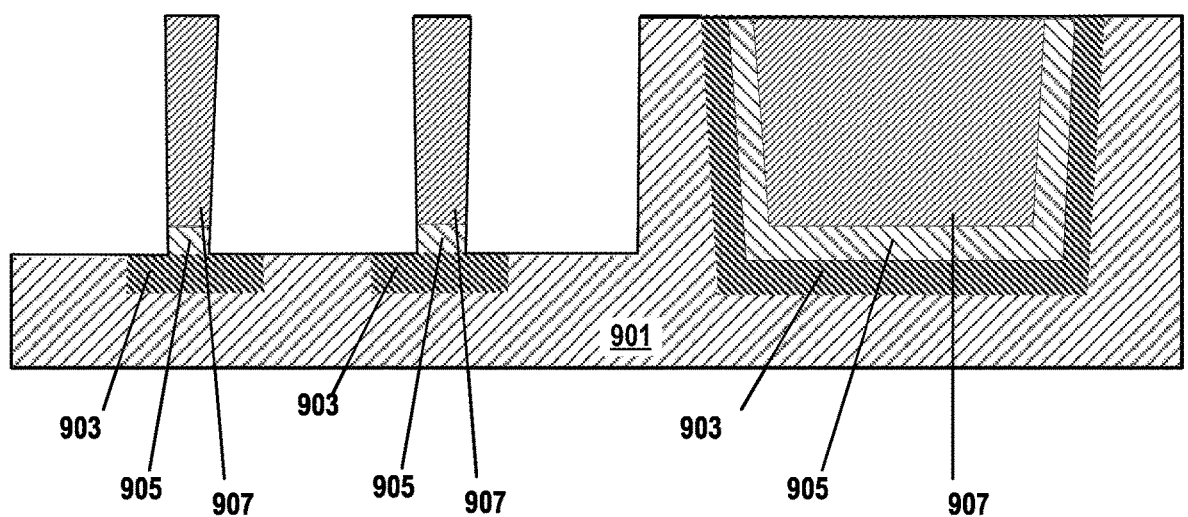
FIG. 10 is a cross-sectional diagram depicting the structure after the exposed barrier layer and liner layer are removed according to a third embodiment of the invention.

FIG. 10 is a cross-sectional diagram depicting the structure after the exposed portions of the barrier layer and liner layer are removed according to a third embodiment of the invention. In this drawing, as the bottom section of barrier layer is protected in the smaller features, the width of the barrier layer 903 is broader than the widths of the liner layer 905 and copper/copper alloy layer 907 in the small features at this point in the process. In the small features, the width of the liner layer 905 and the copper layer 907 are substantially coplanar in a vertical direction.

Figure 11:
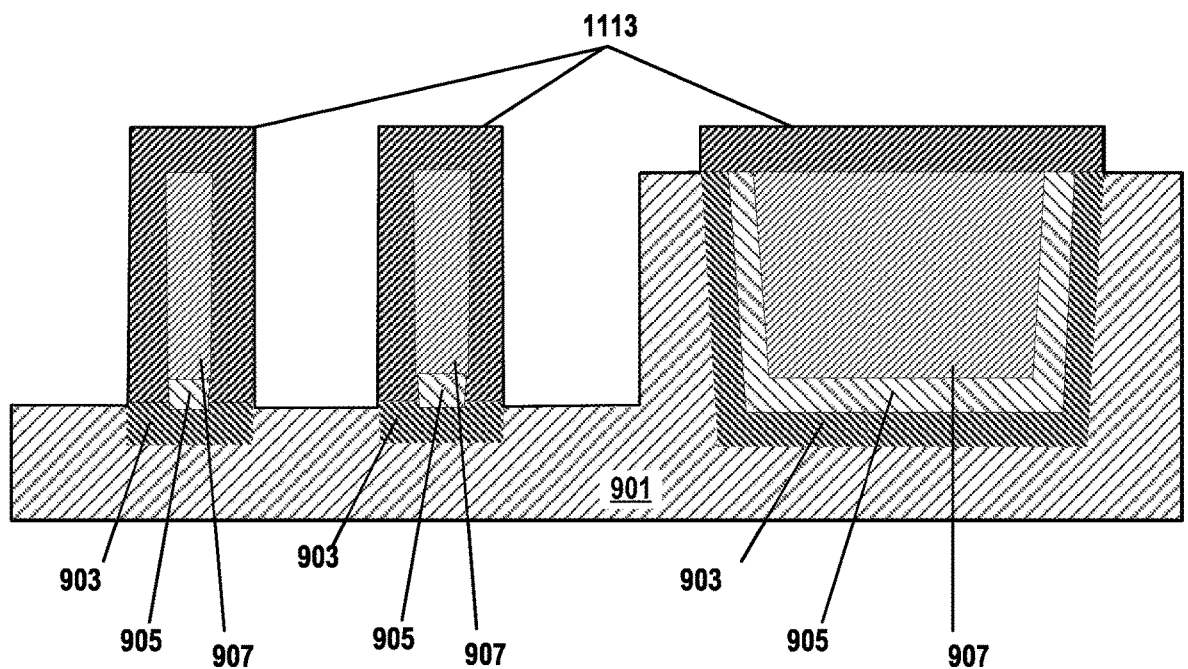
FIG. 11 is a cross-sectional diagram depicting the structure after a selective copper (Cu) deposition process according to a third embodiment of the invention.
Figure 12:
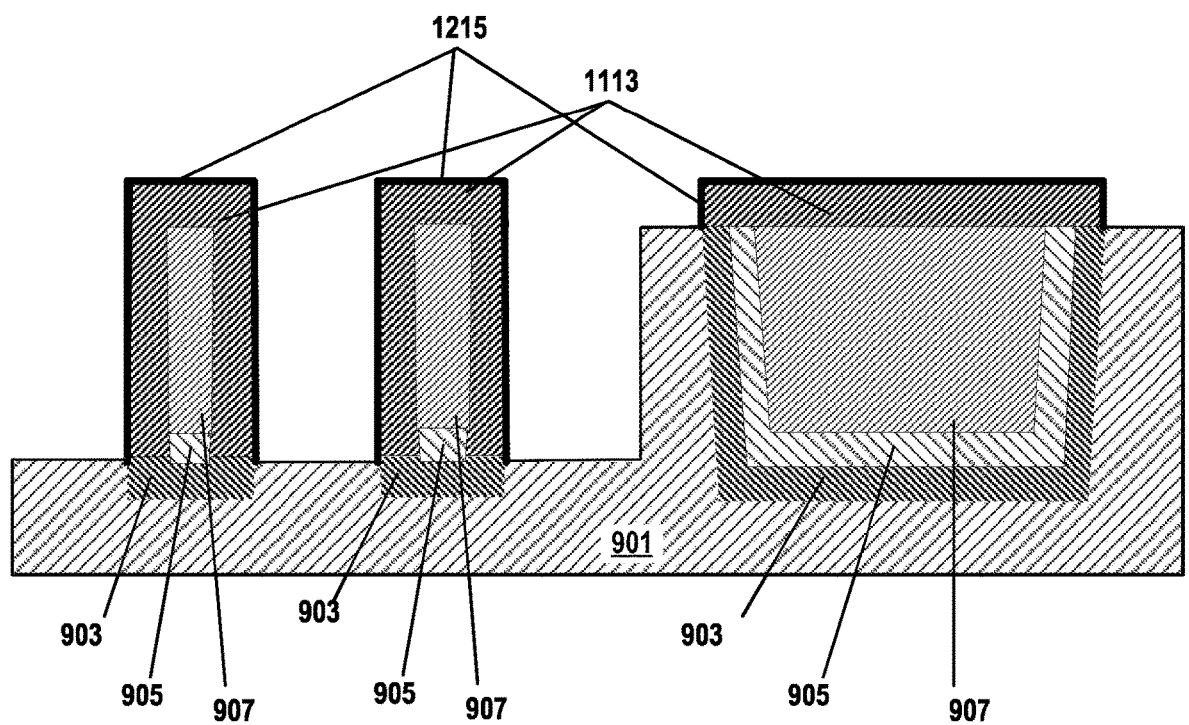
FIG. 12 is a cross-sectional diagram depicting the structure after selective regrowth of a barrier layer according to a third embodiment of the invention.

FIG. 11 is a cross-sectional diagram depicting the structure after a selective copper (Cu) deposition process according to a third embodiment of the invention. The copper forms second metal layer 1113 on the exposed surfaces of the metal layer 907 (also copper), the barrier layer 903 and liner layer 905. That is, the second metal layer 1113 is disposed on the top of both the large and small features and on the sidewalls of the small features. Because of the growth of the copper as second metal layer 1113 on the sidewalls of the small features, the trench width is designed to be smaller for a given target width than in the first and second embodiments FIG. 12 is a cross-sectional diagram depicting the structure after selective regrowth of a barrier layer according to a third embodiment of the invention. The barrier layer material and processes discussed above in connection with FIG. 5 can be used in this embodiment. As shown in the drawing, the second barrier layer 1215 is selectively grown on the exposed surfaces of the existing barrier layer 903, the liner layer 905 and the second metal layer 1113. The processes used in variations of this embodiment for selectively depositing second barrier layer 1215 are similar to those discussed above for the first and second embodiments.

Figure 13:
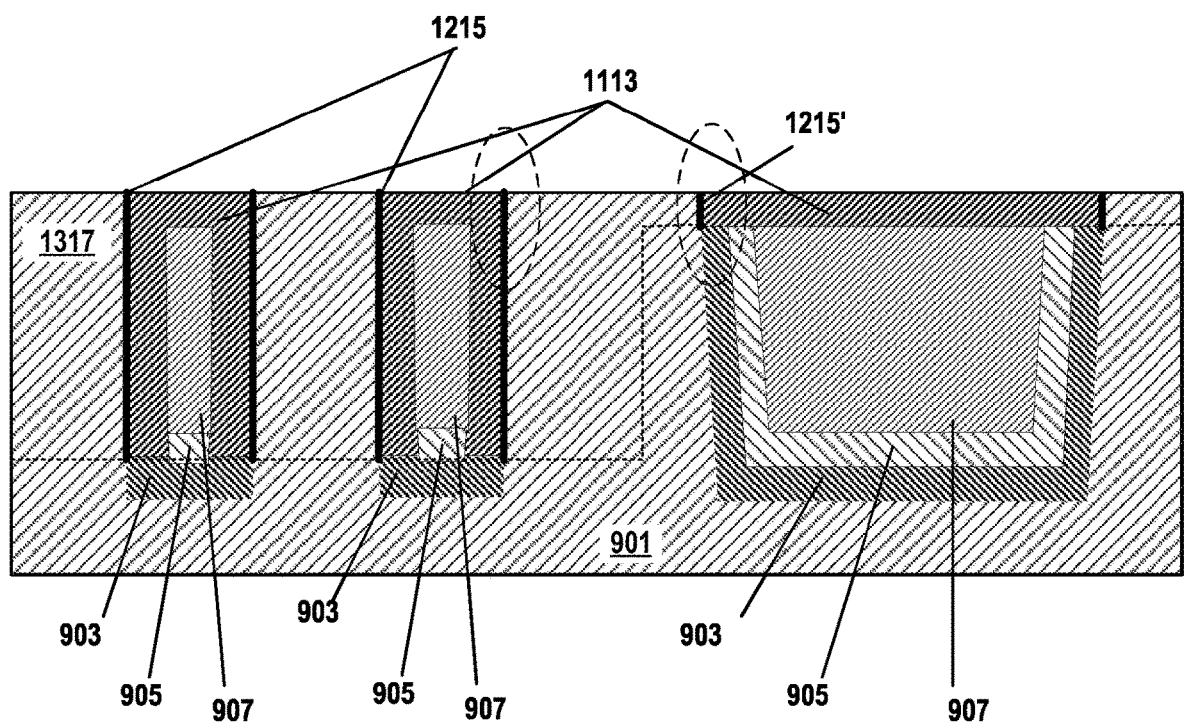
FIG. 13 is a cross-sectional diagram depicting the structure after deposition of a dielectric and a planarization process according to a third embodiment of the invention.

FIG. 13 is a cross-sectional diagram depicting the structure after deposition of a dielectric and a planarization process according to a third embodiment of the invention. Similar materials and processes as discussed above can be used in these steps. In this drawing, the second dielectric layer 1317 increases the overall height of the structure to be coplanar with the planarized top surface of the selectively deposited second metal layer 1113. The top, horizontal portions (shown in FIG. 12) of the second barrier layer 1215 are removed during the planarization process.

As shown in the drawing, in the third embodiment, the width of the barrier layer 903 is broader than the width of the liner layer 905 but is substantially equal and vertically coplanar to the total width of the copper layer 907, 1113 in the small features. As compared to the first and second embodiments, the height of the overall copper layer 907 and 1113 is greater than the initial height of the planarized barrier layer 903, liner layer 905 and dielectric layer 901 and coplanar with the top surfaces of selectively deposited Cu layer 1113, selectively deposited barrier layer 1215 and second dielectric layer 1317. Similar to the first and second embodiments, the overall width of the barrier layer 903 is greater than the overall width of the liner layer 905 and the overall width of the barrier layer 905 is greater than the overall width of a first copper layer 907 in the large features. As noted by the dotted ellipses in the drawing, the top corners of the small (or selected) features are different from top corners of the large features. In the small features, the thickness of the overall barrier layer 1215 is constant throughout much of an upper portion of the small features while the overall thickness of the barrier layers 703, 1215 varies with the height of the large features. Also, near the corner of the large features, after the depth of the selectively deposited copper layer 1113, there is the first barrier layer 903 and the liner layer 905, whereas in the small features, there is no liner layer 905 until the after the depth of the originally deposited copper layer 907.

In variations of this embodiment of the invention, it is possible to stop the etch at the top surface of the liner layer 905, but it is important to retain at least some thickness of the barrier layer 903 (e.g., 1 nm) to prevent diffusion of the copper layer into the dielectric layer 901.

Figure 14:
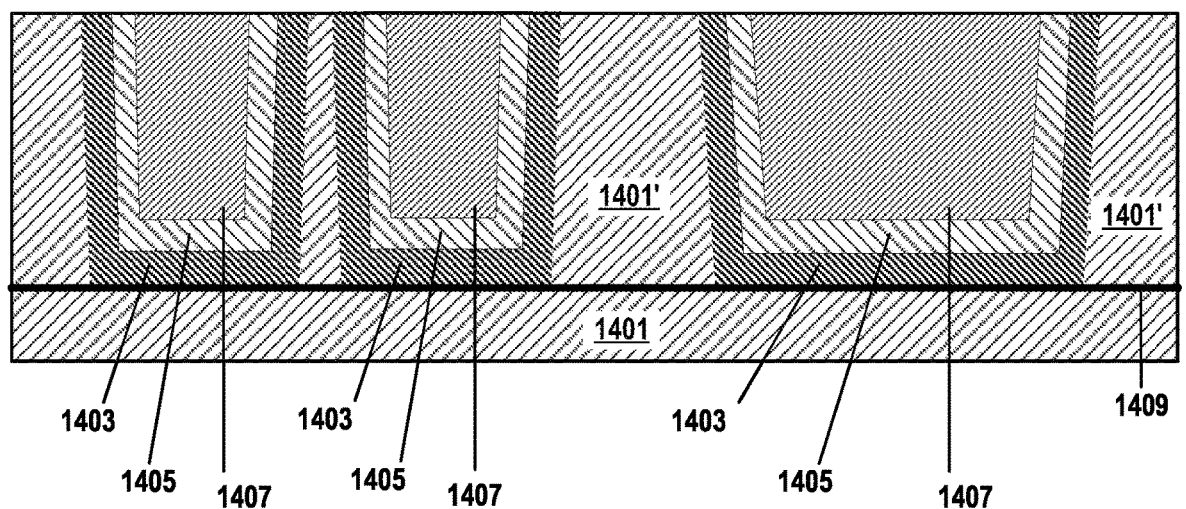
FIG. 14 is a cross-sectional diagram depicting the structure in an intermediate stage after etch stop layer, barrier layer, liner layer and copper depositions followed by a planarization process according to a fourth embodiment of the invention.

FIG. 14 is a cross-sectional diagram depicting the structure in an intermediate stage after the etch stop layer, the second dielectric layer, the barrier layer, the liner layer and the copper depositions followed by a planarization process according to a fourth embodiment of the invention. This embodiment is similar to the first embodiment; it primarily differs with the addition of the etch stop layer 1409. Because of the presence of the etch stop layer 1409, the dielectric (dielectric layers 1401, 1401') comparable to the prior embodiments is deposited in two separate deposition steps as two separate layers with the etch stop layer 1409 being above dielectric layer 1401 and beneath dielectric layer 1401'. That is, a separate dielectric deposition step is needed to deposit dielectric layer 1401' on top of the etch stop layer 1409. The etch stop layer is useful for creating the trenches in dielectric layer 1401' as well as selectively clearing the dielectric layer 1401' in the small, tighter areas (or selected layers) of the interconnections.

After the trench etch, barrier layer 1403 is deposited on etch stop layer 1409 and dielectric layer 1401'. In some embodiments, liner layer 1405 is deposited on the surface of barrier layer 1403. On top of liner layer 1405 is metal layer 1407. This embodiment is similar to the first embodiment at the stage depicted in FIG. 2 with the addition of the etch stop layer 1409 beneath dielectric layer 1401'. If a low-k dielectric is used for dielectric layer 1401', $SiO_2$ is a suitable etch stop layer 1409. In other embodiments, the etch stop layer 1409 is selected based on the dielectric used in dielectric layer 1401'. Generally, the etch stop layer 1409 is an insulating layer to avoid shorts between the conducting features, i.e., metal lines composed of layers 1403, 1405 and 1407. The dielectrics used in dielectric layers 1401 and 1401' can be the same or different dielectrics. Because of other desired device characteristics, in preferred embodiments, both dielectric layers 1401 and 1401' should use a low-k dielectric. Most dielectrics which can be used as etch stop layers, when a low-k dielectric is used predominately, have an undesirable higher dielectric constant which negatively impacts device performance, so the etch stop layer should be as thin as possible and low-k dielectrics used as much as possible for a chip design using small dimensions.

In the preferred embodiments, metal layer 1407 is comprised of copper or a copper alloy. As above, the copper layer 1407 is preferably deposited as a Cu overburden layer and the excess Cu overburden layer, barrier layer and liner layer materials are removed by a planarization process.

Figure 15:
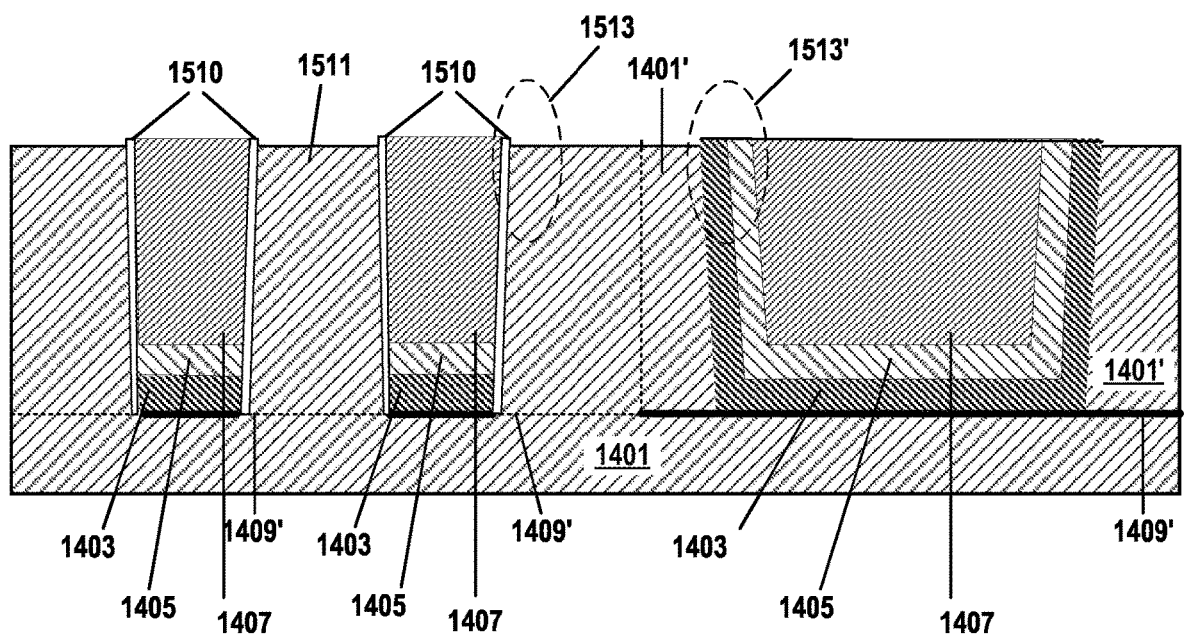
FIG. 15 is a cross-sectional diagram depicting the structure after deposition of a dielectric and a planarization process according to the fourth embodiment of the invention.

FIG. 15 is a cross-sectional diagram depicting the structure after deposition of a dielectric and a planarization process according to the fourth embodiment of the invention. Similar materials and processes as discussed above can be used in these steps. In this drawing, the added, planarized portion of second dielectric layer 1511 is present in the cleared section of the dielectric layer 1401' in the small and/or selected features region(s).

The processing and materials in the fourth embodiment are similar to those in the first embodiment; it primarily differs with the addition of the etch stop layer 1409'. In the drawing, the etch stop layer 1409' has been etched through during the etch which removes the dielectric in the small feature region and so is no longer contiguous. However, the etches might stop on the etch stop layer in which case the etch stop layer would be contiguous. In the drawing, the etch stop layer 1409' is only under the bottom of the trenches and the areas protected by a block mask during this etch processes.

The differences between the small (or selected) features and the large (or unselected) features are very similar to the first embodiment. That is, the barrier layer 1403 is thicker on the sidewalls of the larger features than the barrier layer 1510 is on the sidewalls of the smaller features. Also, in embodiments of the invention, the liner layer 1405 is present on the sidewalls of the larger features, but not on the sidewalls of the smaller, selected features. Note also that the barrier layer 1403 and liner layer 1405 are equal in thickness for both types of features at the bottoms of the features. Also, in this embodiment, the widths of the barrier layer 1403, the liner layer 1405 and the metal layer 1407 are substantially equal in the small features, while the overall width of the barrier layer 1403 is greater than the overall width of the liner layer 1405, while the overall width of the barrier layer 205 is greater than the overall width of the metal layer 1407 in the large features.

As is known to the art, the structure is followed by additional processing to fabricate contacts for structures which attach the chip to a packaging substrate so that the chip can be incorporated into a computing device. After completing the integrated circuits in the wafer, the wafer is diced and the individual chips are placed on their respective substrates.

The invention has advantages over the prior art. Because the features in tightly pitched and loosely pitched regions can have different proportions of copper, barrier and liner layers, the conductivity and resistivity of individual features on each metal interconnect layer (M1, V1, M2, V2, etc.) of the chip can be tailored to desired values. Relatively small features are comprised of copper surrounded on the sidewalls by the single, second layer of barrier layer, while relatively large features have copper surrounded by sidewalls of the first layer of barrier layer and, optionally, a liner layer. This achieves the desired resistivity and conductivity for small features, while allowing the larger features which have a sufficient proportion of copper to be protected from the etch steps. Where the etch steps can be well controlled, the entire metal level can have the inventive metal structure.

The resulting structure can be included within integrated circuit chips, which can be distributed by the fabricator in wafer form (that is, as a single wafer that has multiple chips), as a bare die, or in a packaged form. In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only a limited number of features are illustrated in the drawings, those ordinarily skilled in the art would understand that many different types of features could be simultaneously formed with the embodiments herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having described our invention, what we now claim is as follows:

1. A structure comprising:
   a first interconnect structure comprising a first interconnect metal;
   a first liner surrounding a bottom and sides of the first interconnect metal;
   a first barrier layer surrounding a bottom and sides of the first liner;
   a second interconnect structure comprising a second interconnect metal;
   a second liner surrounding a bottom of the second interconnect metal;
   a second barrier layer surrounding a bottom of the second liner;
   a third barrier layer surrounding sides of the second interconnect metal, sides of the second liner, and sides of the second barrier layer; and
   an etch stop layer below the first barrier layer and below the second barrier layer, wherein the third barrier layer directly contacts sidewalls of the etch stop layer.

2. The structure according to claim 1, wherein the first barrier layer and the second barrier layer are the same material.

3. The structure according to claim 1, wherein the second barrier layer and the third barrier layer are the same material.

4. The structure according to claim 1, wherein the first liner and the second liner are the same material.

5. The structure according to claim 1, wherein a lateral thickness of the third barrier layer is less than a vertical thickness of the second barrier layer.

6. The structure according to claim 1, wherein the second liner and the second barrier layer are entirely below the second interconnect metal.

7. A structure comprising:
   a first interconnect structure comprising a first interconnect metal;
   a first liner directly contacting a bottom and sides of the first interconnect metal;
   a first barrier layer directly contacting a bottom and sides of the first liner;
   a second interconnect structure comprising a second interconnect metal;
   a second liner directly contacting a bottom of the second interconnect metal;
   a second barrier layer directly contacting a bottom of the second liner;
   a third barrier layer directly contacting sides of the second interconnect metal, sides of the second liner, and sides of the second barrier layer; and
   an etch stop layer below the first barrier layer and below the second barrier layer, wherein the third barrier layer directly contacts sidewalls of the etch stop layer.

8. The structure according to claim 7, wherein the first barrier layer and the second barrier layer are the same material.

9. The structure according to claim 7, wherein the second barrier layer and the third barrier layer are the same material.

10. The structure according to claim 7, wherein the first liner and the second liner are the same material.

11. The structure according to claim 7, wherein a lateral thickness of the third barrier layer is less than a vertical thickness of the second barrier layer.

12. The structure according to claim 7, wherein the second liner and the second barrier layer are entirely below the second interconnect metal.

13. A structure comprising:
- a first interconnect structure comprising a first interconnect metal;
- a first liner surrounding a bottom and sides of the first interconnect metal;
- a first barrier layer surrounding a bottom and sides of the first liner;
- a second interconnect structure comprising a second interconnect metal;
- a second liner surrounding entirely below and directly contacting the second interconnect metal;
- a second barrier layer entirely below and directly contacting the second liner;
- a third barrier layer directly contacting sidewalls of the second interconnect metal, sidewalls of the second liner, and sidewalls of the second barrier layer; and
- an etch stop layer below the first barrier layer and below the second barrier layer, wherein the third barrier layer directly contacts sidewalls of the etch stop layer.

14. The structure according to claim 13, wherein the first barrier layer and the second barrier layer are the same material.

15. The structure according to claim 13, wherein the second barrier layer and the third barrier layer are the same material.

16. The structure according to claim 13, wherein the first liner and the second liner are the same material.

17. The structure according to claim 13, wherein a lateral thickness of the third barrier layer is less than a vertical thickness of the second barrier layer.

\* \* \* \* \*